US012762388B2

(12) United States Patent
Nam et al.

(10) Patent No.: US 12,762,388 B2
(45) Date of Patent: Oct. 13, 2026

(54) FERROELECTRIC MEMORY DEVICE AND ELECTRONIC DEVICE INCLUDING THE SAME

(71) Applicant: Samsung Electronics Co., Ltd., Suwon-si (KR)

(72) Inventors: Seunggeol Nam, Suwon-si (KR); Hagyoul Bae, Suwon-si (KR); Jinseong Heo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 829 days.

(21) Appl. No.: 18/053,182

(22) Filed: Nov. 7, 2022

(65) Prior Publication Data

US 2023/0153592 A1 May 18, 2023

(30) Foreign Application Priority Data

Nov. 17, 2021 (KR) ........................ 10-2021-0158834
Jul. 25, 2022 (KR) ........................ 10-2022-0092041

(51) Int. Cl.
*G06N 3/063* (2023.01)
*G11C 11/22* (2006.01)
(Continued)

(52) U.S. Cl.
CPC ............ *G06N 3/063* (2013.01); *G11C 11/223* (2013.01); *G11C 11/2255* (2013.01); (Continued)

(58) Field of Classification Search
CPC ........ H10B 51/20; H10B 51/30; G06N 3/063; G11C 11/223; G11C 11/2255; G11C 11/2257; G11C 11/54
See application file for complete search history.

(56) References Cited

U.S. PATENT DOCUMENTS 6,411,548 B1 * 6/2002 Sakui ................. G11C 16/0483 365/185.12
10,468,432 B1 * 11/2019 Han ....................... H10B 63/22
(Continued)

FOREIGN PATENT DOCUMENTS

DE 102020207439 A1 * 12/2021 ............. G06N 3/065
JP H06104447 A 4/1994
(Continued)

OTHER PUBLICATIONS

Sridhar Chandrasekaran et al., 'Enhanced Synaptic Linearity in ZnO-Based Invisible Memristive Synapse by Introducing Double Pulsing Scheme' IEEE Transactions on Electron Devices, vol. 66, No. 11, Nov. 2019, p. 4722-4726.
(Continued)

*Primary Examiner* — Matthew E Warren
(74) *Attorney, Agent, or Firm* — HARNESS, DICKEY & PIERCE, P.L.C.

(57) ABSTRACT

A ferroelectric memory device may include a source, a drain, a channel layer between the source and the drain and connected to the source and the drain, a first gate electrode and a second gate electrode located on the channel layer to be spaced apart from each other, and a ferroelectric layer between the channel layer and the first gate electrode and between the channel layer and the second gate electrode. Different voltages may be applied to the first gate electrode and the second gate electrode.

15 Claims, 14 Drawing Sheets

(51) Int. Cl.
*G11C 11/54* (2006.01)
*H10B 51/20* (2023.01)
*H10B 51/30* (2023.01)

(52) U.S. Cl.
CPC .......... *G11C 11/2257* (2013.01); *G11C 11/54* (2013.01); *H10B 51/20* (2023.02); *H10B 51/30* (2023.02)

(56) References Cited

U.S. PATENT DOCUMENTS

| | | | | |
|---|---|---|---|---|
| 10,585,643 | B2 | 3/2020 | Gu et al. | |
| 10,840,253 | B2 | 11/2020 | Tan et al. | |
| 2015/0100532 | A1* | 4/2015 | Yamaguchi ............ | G06N 3/063 706/33 |
| 2019/0096462 | A1 | 3/2019 | Han et al. | |
| 2019/0189311 | A1 | 6/2019 | Abel et al. | |
| 2019/0252500 | A1 | 8/2019 | Frank et al. | |
| 2020/0099379 | A1 | 3/2020 | Sharma et al. | |
| 2020/0143879 | A1* | 5/2020 | Alessandri ............... | G06N 3/04 |
| 2020/0194049 | A1* | 6/2020 | Nikonov ................ | G06N 3/065 |
| 2021/0066318 | A1 | 3/2021 | Chang | |
| 2021/0193207 | A1* | 6/2021 | Mizusaki ............ | G11C 11/2275 |
| 2023/0292523 | A1 | 9/2023 | Song | |

FOREIGN PATENT DOCUMENTS

| | | | | | |
|---|---|---|---|---|---|
| JP | H07106528 | A | * | 4/1995 | |
| KR | 20200063555 | A | * | 6/2020 | ............ G06N 3/063 |
| KR | 10-2022-0036208 | A | | 3/2022 | |

OTHER PUBLICATIONS

Extended European Search Report, dated Mar. 23, 2023, issued in corresponding European Patent Application No. 22207222.5.

Korean Office Action dated Jul. 20, 2026 issued in corresponding Korean Appln. No. 10-2022-0092041 (with English translation).

* cited by examiner

FERROELECTRIC MEMORY DEVICE AND ELECTRONIC DEVICE INCLUDING THE SAME

CROSS-REFERENCE TO RELATED APPLICATIONS

This application is based on and claims priority under 35 U.S.C. § 119 to Korean Patent Application Nos. 10-2021-0158834 and 10-2022-0092041, respectively filed on Nov. 17, 2021 and Jul. 25, 2022 in the Korean Intellectual Property Office, the disclosures of which are incorporated by reference herein in their entireties.

BACKGROUND

1. Field

The present disclosure relates to a ferroelectric memory device and an electronic device including the same.

2. Description of the Related Art

There has been a growing interest in neuromorphic processors that perform neural network operations. A neuromorphic processor may be used as a neural network device for driving various neural networks, such as a convolutional neural network (CNN), a recurrent neural network (RNN), and a feedforward neural network (FNN) and may be used in the fields which involve data classification or image recognition.

A neuromorphic processor may include a plurality of memory cells for storing weights. A memory cell may be implemented using various elements. Recently, to reduce the area of a memory cell and to reduce power consumption, a non-volatile memory having a simple structure has been suggested as a memory cell of a neuromorphic processor.

A pattern recognition rate in a neuromorphic processor may be determined by a change in conductance between a source and a drain due to a gate voltage applied to a memory cell. As the linearity of a slope with which conductance increases (potentiation) and decreases (depression) when voltages of two different polarities are applied to gate electrodes increases, a pattern recognition rate increases. In order to secure linear response characteristics, a method of using a specific material or adjusting an amplitude and time of a gate voltage may be used.

SUMMARY

Provided is a memory device having improved linear response characteristics to an applied voltage.

Additional aspects will be set forth in part in the description which follows and, in part, will be apparent from the description, or may be learned by practice of the presented embodiments.

According to example embodiment, a ferroelectric memory device may include a source, a drain, a channel layer between the source and the drain and connected to the source and the drain, a first gate electrode on the channel layer, a second gate electrode on the channel layer and spaced apart from the first gate electrode in a first direction, and a ferroelectric layer. The ferroelectric layer may be between the channel layer and the first gate electrode and the ferroelectric layer may be between the channel layer and the second gate electrode.

In some embodiments, the first direction may be perpendicular to a stacking direction in which the channel layer and the ferroelectric layer are stacked.

In some embodiments, the ferroelectric memory device may further include an insulating layer between the ferroelectric layer and the channel layer.

In some embodiments, the ferroelectric memory device may further include a voltage applying unit configured to apply voltages to the first gate electrode and the second gate electrode.

In some embodiments, the voltage applying unit may be further configured to apply a pulse voltage to any one of the first gate electrode and the second gate electrode, and apply a direct current (DC) voltage or a different type of pulse voltage from the pulse voltage to an other of the first gate electrode and the second gate electrode.

In some embodiments, the voltage applying unit may be further configured to apply a first voltage to the first gate electrode and to apply a second voltage to the second gate electrode. The first voltage may be a pulse voltage and the second voltage may be a DC voltage.

In some embodiments, a pulse pattern of the first voltage may be a rectangular pulse pattern or a triangular pulse pattern.

In some embodiments, the voltage applying unit may be further configured to apply a first voltage to the first gate electrode and to apply a second voltage to the second gate electrode. The first voltage may be a pulse voltage and the second voltage may be a different type of voltage from the first voltage.

In some embodiments, a pulse width of the first voltage and a pulse width of the second voltage may be same, a pulse interval of the first voltage and a pulse interval of the second voltage may be same, and a pulse value of the first voltage and a pulse value of the second voltage may have different signs.

In some embodiments, the ferroelectric memory device may further include an insulating structure on a first surface of the channel layer. The first surface of the channel layer may be opposite a second surface of the channel layer. The second surface of the channel layer may face the ferroelectric layer.

In some embodiments, the insulating structure may have a cylindrical shape or a cylindrical shell shape. The insulating structure may have a center axis parallel to the first direction. The ferroelectric layer may surround the insulating structure. The first gate electrode may be one of a plurality of first gate electrodes. The second gate electrode may be one of a plurality of second gate electrodes. The plurality of first gate electrodes and the plurality of second gate electrodes may be alternately arranged in the first direction. Each of the plurality of first gate electrodes may surround the ferroelectric layer at different positions in the first direction.

In some embodiments, the ferroelectric memory device may include a metal filler and the insulating structure may have a cylindrical shape or a cylindrical shell shape and may surround the metal filler.

In some embodiments, the ferroelectric layer may include at least one of an oxide of Si doped with at least one of Al, Y, La, Gd, Mg, Ca, Sr, Ba, Ti, Zr, Hf, and N; an oxide of Al doped with at least one of Si, Y, La, Gd, Mg, Ca, Sr, Ba, Ti, Zr, Hf, and N; an oxide of Hf doped with at least one of Si, Al, Y, La, Gd, Mg, Ca, Sr, Ba, Ti, Zr, and N; an oxide of Zr doped with at least one of Si, Al, Y, La, Gd, Mg, Ca, Sr, Ba, Ti, Hf, and N; MgZnO; AlScN; $BaTiO_3$; $Pb(Zr,Ti)O_3$; $SrBiTaO_7$; or polyvinylidene fluoride (PVDF).

In some embodiments, the channel layer may include at least one of Si, Ge, SiGe, a group III-V semiconductor, an oxide semiconductor, a nitride semiconductor, an oxynitride semiconductor, a two-dimensional (2D) material, quantum dots, and an organic semiconductor.

According to an example embodiment, a neural network device may include a plurality of word lines, a plurality of bit lines intersecting the plurality of word lines, a plurality of input lines, a plurality of output lines, and a plurality of synaptic elements at intersections between the plurality of word lines and the plurality of bit lines. Each of the plurality of synaptic elements may be electrically connected to a corresponding one of the plurality of word lines, a corresponding one of the plurality of bit lines, a corresponding one of the plurality of input lines, and a corresponding one of the plurality of output lines. Each of the plurality of synaptic elements may include a ferroelectric memory cell. The ferroelectric memory cell may include a source, a drain, a channel layer between the source and the drain and connected to the source and the drain, a first gate electrode on the channel layer, a second gate electrode on the channel layer and spaced apart from the first gate electrode in a first direction, and a ferroelectric layer between the channel layer and the first gate electrode. The ferroelectric layer may be between the channel layer and the second gate electrode.

In some embodiments, the neural network device may further include a word line driver configured to apply a signal to the plurality of word lines; a bit line driver configured to apply a signal to the plurality of bit lines; an input circuit configured to apply a signal to the plurality of input lines; and an output circuit configured to output a signal from the plurality of output lines.

In some embodiments, the ferroelectric memory cell of a corresponding one of the plurality of synaptic elements may be a corresponding ferroelectric memory cell. The source of the corresponding ferroelectric memory cell may be electrically connected to one of the plurality of input lines, and the drain of the corresponding ferroelectric memory cell may be electrically connected to one of the plurality of output lines.

In some embodiments, the ferroelectric memory cell of a corresponding one of the plurality of synaptic elements may be a corresponding ferroelectric memory cell. The word line driver and the bit line driver may be further configured to apply different voltages to the first gate electrode and the second gate electrode of the corresponding ferroelectric memory cell.

In some embodiments, the word line driver and the bit line driver may be configured to apply a pulse voltage to any one of the first gate electrode and the second gate electrode and may be configured to apply a direct current (DC) voltage or a different type of pulse voltage from the pulse voltage to another of the first gate electrode and the second gate electrode.

In some embodiments, an electronic device may include the neural network device, a memory, and a processor configured to control a function of the neural network device by executing programs stored in the memory. The neural network device may be configured to perform a neural network operation, based on input data received from the processor, and may be configured to generate an information signal corresponding to the input data based on a result of the neural network operation.

According to an example embodiment, a ferroelectric memory device may include a substrate; a common source region on the substrate; a channel layer on the common source region, the channel layer extending in a direction perpendicular to a surface of the common source region; a ferroelectric layer on the common source region, the ferroelectric layer surrounding the channel layer and extending in the direction perpendicular to the surface of the common source region; a drain on the channel layer; and a plurality of first gate electrodes and a plurality of second gate electrodes alternately arranged and spaced apart from each other along the ferroelectric layer and in the direction perpendicular to the surface of the common source region.

In some embodiments, the ferroelectric memory device may further include an insulating layer between the channel layer and the ferroelectric layer.

In some embodiments, the ferroelectric memory device may further include at least one of: an oxide of Si doped with at least one of Al, Y, La, Gd, Mg, Ca, Sr, Ba, Ti, Zr, Hf, and N; an oxide of Al doped with at least one of Si, Y, La, Gd, Mg, Ca, Sr, Ba, Ti, Zr, Hf, and N; an oxide of Hf doped with at least one of Si, Al, Y, La, Gd, Mg, Ca, Sr, Ba, Ti, Zr, and N; an oxide of Zr doped with at least one of Si, Al, Y, La, Gd, Mg, Ca, Sr, Ba, Ti, Hf, and N; MgZnO; AlScN; $BaTiO_3$; $Pb(Zr,Ti)O_3$; $SrBiTaO_7$; or polyvinylidene fluoride (PVDF).

In some embodiments, a neural network device may include the ferroelectric memory device, a word line driver connected to the plurality of first gate electrodes, and a bit line driver connected to the plurality of second gate electrodes. The word line driver and the bit line driver may be configured to apply different voltages to the plurality of first gate electrodes and the plurality of second gate electrodes.

In some embodiments, an electronic device may include the ferroelectric memory device.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
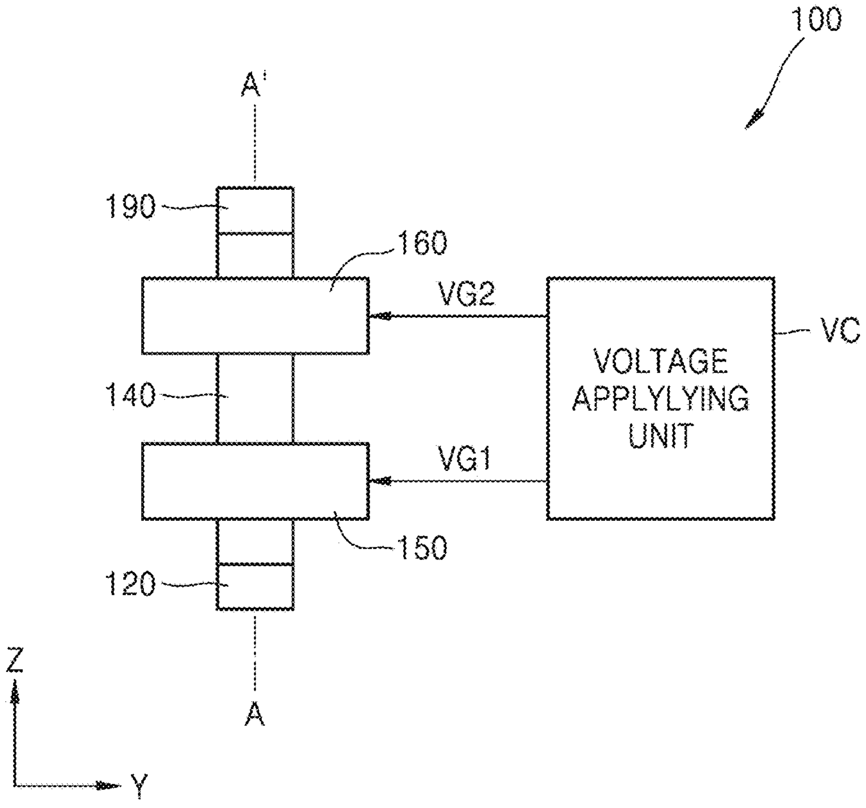
FIG. 1 is a view illustrating a structure of a ferroelectric memory device, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

Embodiments will be described in detail with reference to the attached drawings. The embodiments described below are merely examples, and various modifications may be made from the embodiments. Like reference numerals denote like elements throughout, and in the drawings, sizes of elements may be exaggerated for clarity and convenience of explanation.

When an element is referred to as being "on" another element, it may be directly on the other element, or intervening elements may be present therebetween.

It will be understood that although the terms "first," "second," etc. may be used herein to describe various elements, these elements should not be limited by these terms. These terms are only used to distinguish one element from another. There terms do not limit that materials or structures of elements are different from each other.

The singular forms "a," "an," and "the" are intended to include the plural forms as well, unless the context clearly indicates otherwise. When a portion "includes" an element, another element may be further included, rather than excluding the existence of the other element, unless otherwise described.

The term used in the embodiments such as " . . . unit" or "module" indicates a unit for processing at least one function or operation, and may be implemented in hardware, software, or in a combination of hardware and software.

The use of the terms "a" and "an," and "the" and similar referents in the context of describing the disclosure is to be construed to cover both the singular and the plural.

The steps of all methods described herein may be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed.

Figure 2:
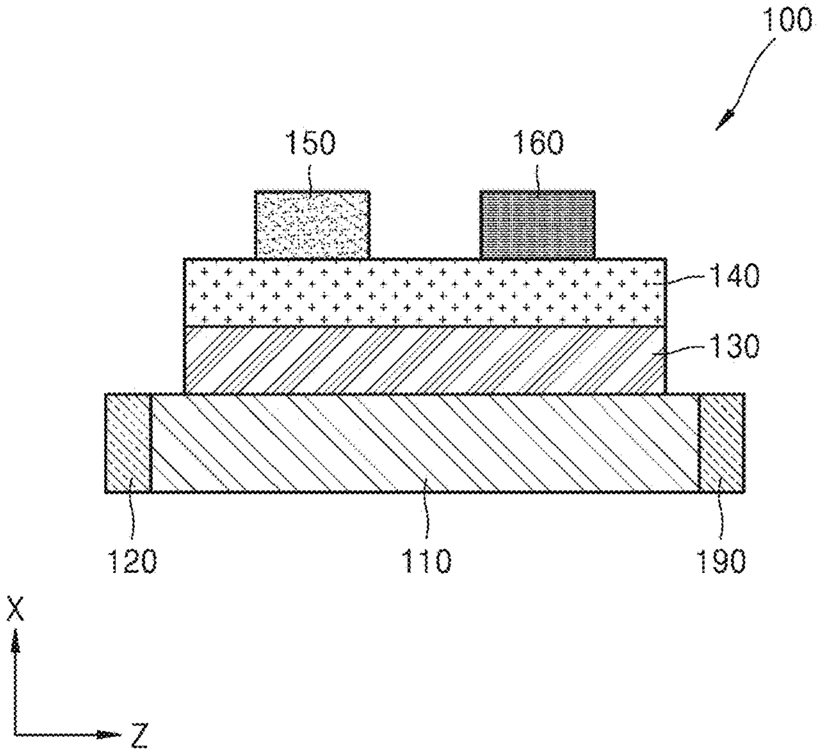
FIG. 2 is a cross-sectional view taken along line AA' of FIG. 1.

FIG. 1 is a view illustrating a structure of a ferroelectric memory device, according to an embodiment. FIG. 2 is a cross-sectional view taken along line AA' of FIG. 1.

A ferroelectric memory device 100 includes a channel layer 110, a source 120 and a drain 190 connected to both ends of the channel layer 110, a first gate electrode 150 and a second gate electrode 160 located on the channel layer 110 to be spaced apart from each other, and a ferroelectric layer 140 located between the channel layer 110 and the first gate electrode 150 and between the channel layer 110 and the second gate electrode 160.

A direction in which the first gate electrode 150 and the second gate electrode 160 are spaced apart from each other may be different from a stacking direction, that is, a direction (X direction) in which the ferroelectric layer 140 is stacked on the channel layer 110. The direction in which the first gate electrode 150 and the second gate electrode 160 are spaced apart from each other may be a Z direction perpendicular to the stacking direction (X direction). The direction in which the first gate electrode 150 and the second gate electrode 160 are spaced apart from each other may be parallel to, but not limited to, a direction in which the source 120 and the drain 190 are spaced apart from each other.

An insulating layer 130 may be further located between the ferroelectric layer 140 and the channel layer 110. The insulating layer 130 may be omitted.

The ferroelectric memory device 100 may be a ferroelectric field-effect transistor including two gates that are electrically separated from each other. Individual voltages independent of each other may be applied to the separated gates, that is, the first gate electrode 150 and the second gate electrode 160. By adjusting voltages applied to the first gate electrode 150 and the second gate electrode 160, the linearity of a change in channel conductivity may be improved. In other words, the ferroelectric memory device 100 according to an embodiment may have a change in channel conductivity having improved linearity compared to a case where one gate electrode is provided.

A structure and a material of the ferroelectric memory device 100 will be described in more detail.

The channel layer 110 may include Si, Ge, SiGe, a group III-V semiconductor, an oxide semiconductor, a nitride semiconductor, an oxynitride semiconductor, a two-dimensional (2D) material, quantum dots, or an organic semiconductor. The oxide semiconductor may include InGaZnO or IGZO, the 2D material may include $MoS_2$, transition metal dichalcogenide (TMD), or graphene, and the quantum dots may include colloidal QDs or nanocrystal structures. The channel layer 110 may further include an n-type or p-type dopant in the above material.

The ferroelectric layer 140 may be located on the channel layer 110. The ferroelectric layer 140 may be located to entirely face the channel layer 110. The ferroelectric layer 140 may include a ferroelectric material. The ferroelectric layer 140 may include at least one ferroelectric material selected from among, for example, an oxide of Si, Al, Hf, or Zr doped with at least one dopant selected from among Si, Al, Y, La, Gd, Mg, Ca, Sr, Ba, Ti, Zr, Hf, and N, MgZnO, AlScN, $BaTiO_3$, $Pb(Zr,Ti)O_3$, $SrBiTaO_7$, and polyvinylidene fluoride (PVDF).

A ferroelectric material refers to a material having ferroelectricity in that, even with no electric field applied from the outside, internal electric dipole moments are aligned to maintain spontaneous polarization. A ferroelectric material is a material in which even when a certain voltage is applied to a ferroelectric material and then the voltage is brought back to 0 V, a polarization value semi-permanently remains. A threshold voltage of the ferroelectric field-effect transistor may vary according to a polarization direction of the ferroelectric material included in the ferroelectric layer 140. A polarity (direction) of such remanent polarization may depend on a polarity (direction) of an external voltage. Non-volatile memory characteristics may be implemented, by using such properties. In detail, a direction of an external electric field applied to the ferroelectric layer 140 may be changed, that is, a remanent polarization direction of the ferroelectric layer 140 may be changed, by adjusting voltages applied to the first gate electrode 150 and the second gate electrode 160. The ferroelectric layer 140 may have remanent polarization corresponding to an electric field formed in the ferroelectric layer 140 due to a voltage applied to the first gate electrode 150 and a voltage applied to the second gate electrode 160. Electrical conductivity of the channel layer 110 may be changed by such a polarization direction of the ferroelectric layer 140, and information may be written or checked by using the changed electrical conductivity. The ferroelectric memory device 100 including the ferroelectric layer 140 may be applied to, for example, a non-volatile memory cell of a synaptic element for storing weights of a neuromorphic processor.

The insulating layer 130 located between the channel layer 110 and the ferroelectric layer 140 may include any of various non-conductive materials such as SiO, SiN, AlO, HfO, or ZrO, or a paraelectric material, and may include a combination of two or more materials.

Each of the first gate electrode 150 and the second gate electrode 160 may include at least one selected from the group consisting of a metal, metal nitride, metal carbide, a heavily doped silicon material, and a combination thereof. The metal may include aluminum (Al), cobalt (Co), tungsten (W), molybdenum (Mo), titanium (Ti), or and tantalum (Ta), the metal nitride film may include TiN, TiAlN, TaN, WN, or NbN, and the metal carbide may include metal carbide doped with (or containing) aluminum or silicon, for example, TiAlC, TaAlC, TiSiC, or TaSiC.

Each of the first gate electrode 150 and the second gate electrode 160 may have a structure in which a plurality of materials are stacked. For example, each of the first gate electrode 150 and the second gate electrode 160 may have a stacked structure including a metal nitride layer and a metal layer such as TiN/Al or a stacked structure including a metal nitride layer, a metal carbide layer, and a metal layer such as TiN/TiAlC/W.

Each of the first gate electrode 150 and the second gate electrode 160 is located to entirely face the channel layer 110, that is, to entirely overlap the channel layer 110. The first gate electrode 150 and the second gate electrode 160 share a channel having conductance that varies according to voltages applied to the first gate electrode 150 and the second gate electrode 160, that is, share the channel layer 110.

The ferroelectric memory device 100 may include a voltage applying unit VC (e.g., one or more driving circuits, power circuitry) that applies a first gate voltage VG1 and a second gate voltage VG2 respectively to the first gate electrode 150 and the second gate electrode 160. In the following drawings, the voltage applying unit VC may not be shown. The first gate voltage VG1 and the second gate voltage VG2 may be different voltages. Any one of the first gate voltage VG1 and the second gate voltage VG2 may be a pulse voltage, and the other may be a direct current (DC) voltage. Alternatively, the first gate voltage VG1 and the second gate voltage VG2 may be different types of pulse voltages. The two pulse voltages may have the same interval and width and may have different voltage values. The two pulse voltages may have the same interval and width, and signs of voltage values may be different from each other. However, the disclosure is not limited thereto.

Applying different voltages to the first gate electrode 150 and the second gate electrode 160 as described above may improve the linearity of a change in conductance of the channel layer 110.

In general, in a ferroelectric field-effect transistor, because sharp polarization switching of a ferroelectric material occurs near a coercive voltage, channel conductivity is drastically changed near the coercive voltage. In other words, channel conductivity is non-linearly changed, rather than linearly changed in proportion to applied electrical energy. However, when two different gate voltages are applied as in an embodiment, an effect similar to that obtained when channels having different non-linear conductivities are connected in series may be obtained. For example, non-linear conductivity occurring in a portion of the channel layer 110 facing the first gate electrode 150 due to the first gate voltage VG1 applied to the first gate electrode 150 and non-linear conductivity occurring in a portion of the channel layer 110 facing the second gate electrode 160 due to the second gate voltage VG2 applied to the second gate electrode 160 may be different from each other. From among these conductivities, one is sharp and the other is relatively gentle, and thus, average channel conductivity of the channel layer 110 may be linearly changed.

Figure 3A:
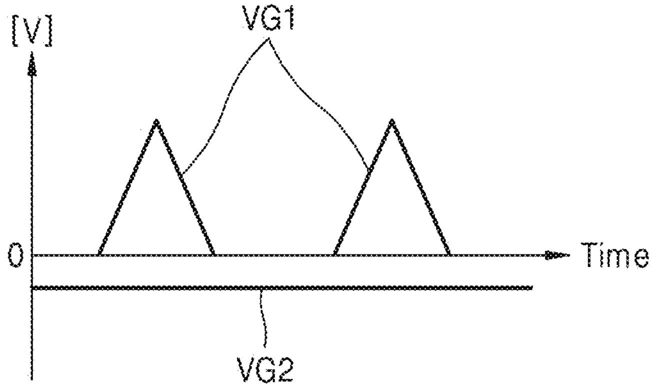
FIGS. 3A through 3C are views illustrating examples where a first gate voltage and a second gate voltage that may be applied to a ferroelectric memory device are combined, according to an embodiment.
Figure 3B:
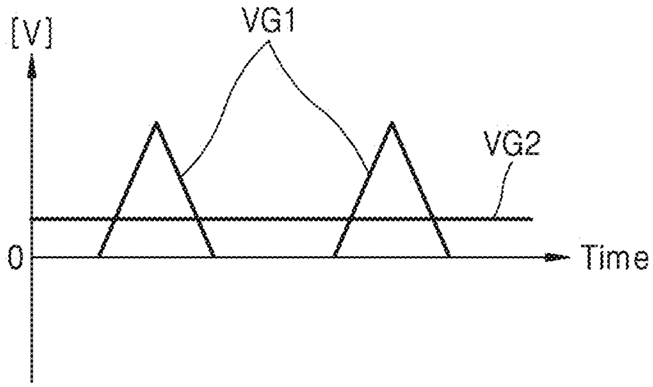
Figure 3C:
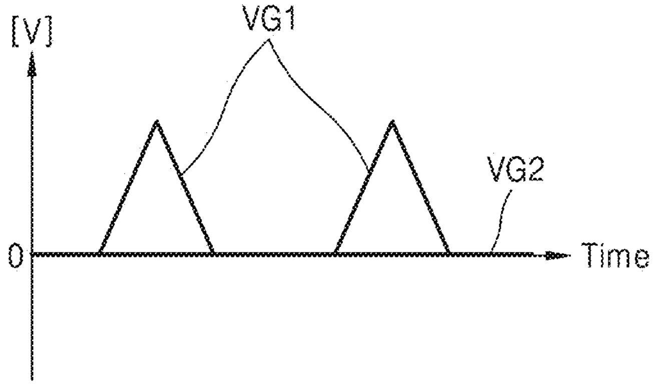
Figure 4:
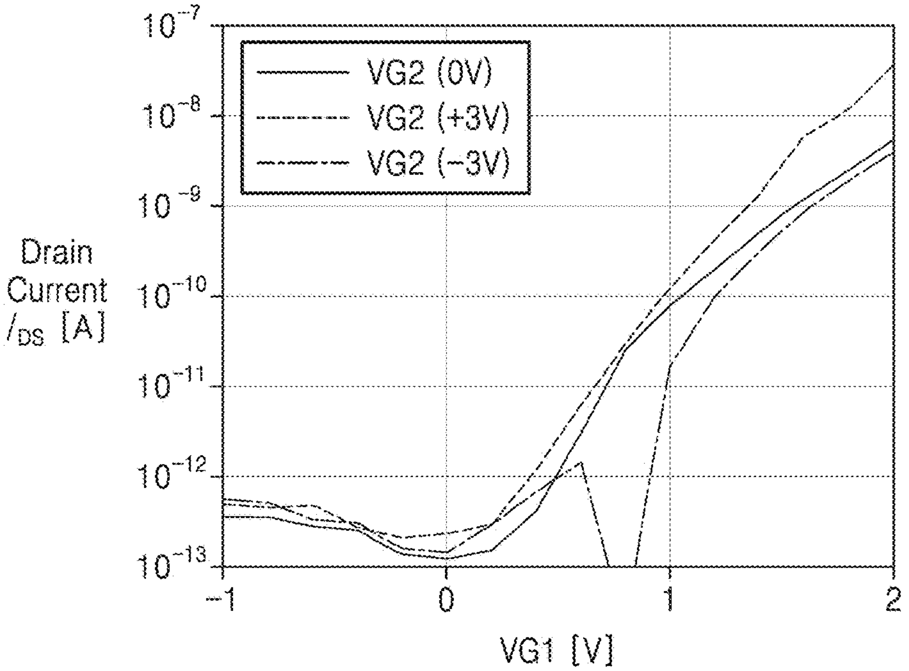
FIG. 4 is a graph showing a gate voltage vs drain current measured while applying different voltages to a first gate electrode and a second gate electrode in a ferroelectric memory device, according to an embodiment.

FIGS. 3A through 3C illustrate examples where a first gate voltage and a second gate voltage that may be applied to a ferroelectric memory device are combined, according to an embodiment. FIG. 4 is a graph showing drain current measured while changing a first gate voltage and a second gate voltage.

FIG. 3A illustrates a case where the first gate voltage VG1 is a triangular pulse voltage having a positive value and the second voltage VG2 is a negative DC voltage.

FIG. 3B illustrates a case where the first gate voltage VG1 is a triangular pulse voltage having a positive value and the second gate voltage VG2 is a positive DC voltage.

FIG. 3C illustrates a case where the first gate voltage VG1 is a triangular pulse voltage having a positive value and the second gate voltage VG2 is 0.

FIG. 4 is a graph showing drain current IDS measured while changing the first gate voltage VG1 in states where the second gate voltage VG2 is fixed to +3 V, 0 V, and −3 V.

In addition to the examples of FIGS. 3A through 4, the first gate voltage VG1 and the second gate voltage VG2 may be combined in various ways. For example, the first gate voltage VG1 and the second gate voltage VG2 suitable for obtaining a desired drain current curve may be set.

Figure 5:
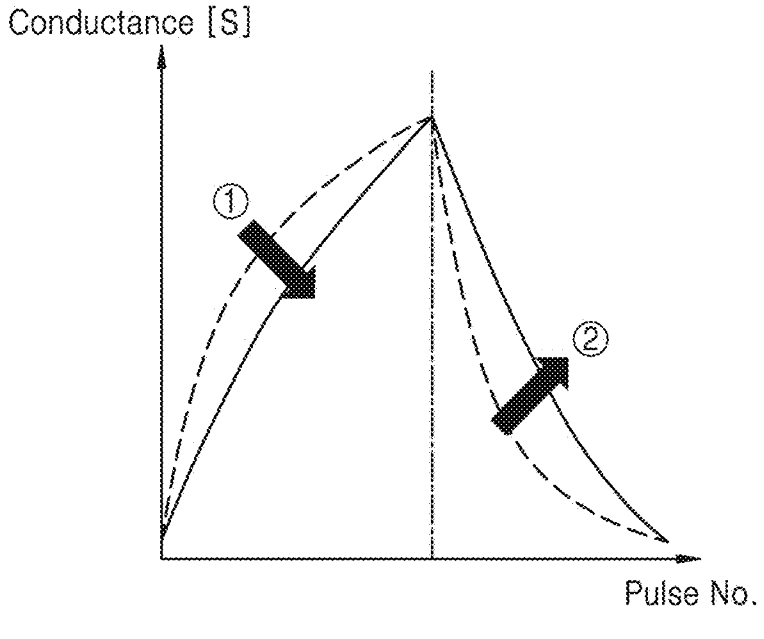
FIG. 5 is a graph for conceptually describing that the linearity of a change in conductance of a ferroelectric memory device is improved, according to an embodiment.

FIG. 5 is a graph for conceptually describing that the linearity of a change in conductance of a ferroelectric memory device is improved, according to an embodiment.

In the graph, the horizontal axis represents the number of pulses of a voltage applied to a gate electrode, and the vertical axis represents channel conductivity.

In the graph, a graph of a region ① in which conductance increases is a potentiation curve according to an increase in the number of applied positive pulses, and a graph of a region ② in which conductance decreases is a depression curve according to an increase in the number of applied negative pulses.

As described above, because sharp polarization switching of a ferroelectric material occurs near a coercive voltage, even when the number of pulses having a constant interval and size increases, a change in channel conductance is non-linear. The potentiation curve and the depression curve may be non-linear as marked by dashed lines.

In the ferroelectric memory device of an embodiment, however, when a positive pulse is applied to one gate electrode, an additional different gate voltage may be applied to the other gate electrode, and when a negative pulse is applied to one gate electrode, an additional different gate voltage may be applied to the other gate electrode. Accordingly, the non-linear curves as marked by the dashed lines may be changed to shapes close straight lines.

Figure 6A:
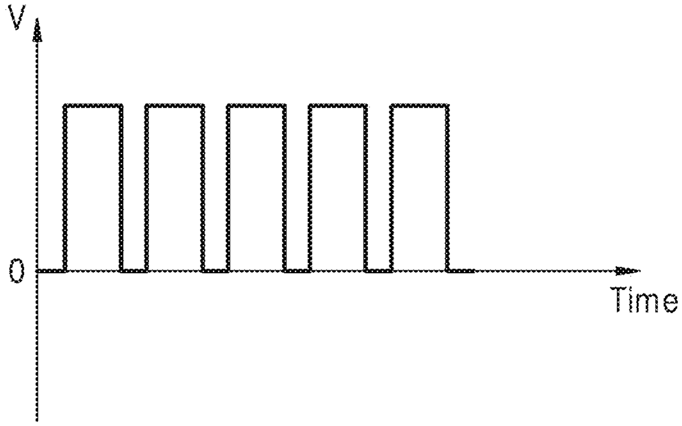
FIGS. 6A and 6B are diagrams illustrating a gate voltage applied to a ferroelectric memory device, according to a comparative example.
Figure 6B:
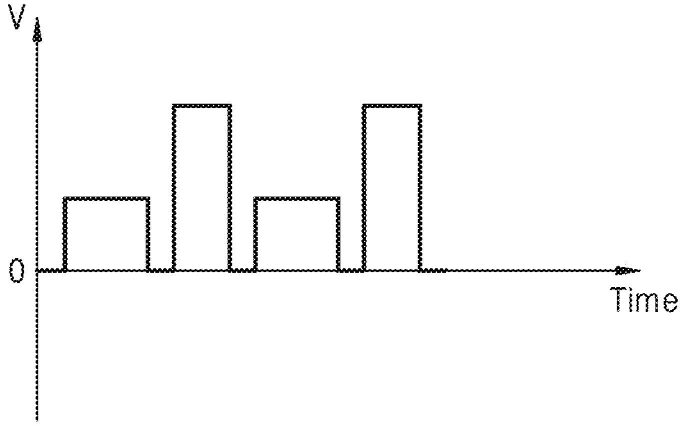

FIGS. 6A and 6B are diagrams illustrating a gate voltage applied to a ferroelectric memory device, according to a comparative example.

A ferroelectric memory device according to a comparative example includes one gate electrode, unlike a ferroelectric memory device of an embodiment.

FIG. 6A illustrates that a pulse voltage having a constant positive value is applied to a gate electrode at a regular interval. Due to such a gate voltage, a potentiation curve as marked by a dashed line in FIG. 5 may be obtained.

During depression, a pulse voltage having a constant negative value and symmetrical to that of FIG. 6A may be applied at a regular interval, and a depression curve as marked by a dashed line in FIG. 5 may be obtained.

FIG. 6B illustrates that a gate voltage whose pulse interval and size are adjusted not to be constant is applied, as a method for improving non-linearity due to a pulse provided as shown in FIG. 6A.

According to this method, the potentiation curve and the depression curve may become more linear, but a process of designing and applying an appropriate pulse program is very complicated.

FIGS. 7A through 7D illustrate other examples where a first gate voltage and a second gate voltage that may be applied to a ferroelectric memory device are combined, according to an embodiment.

Figure 7A:
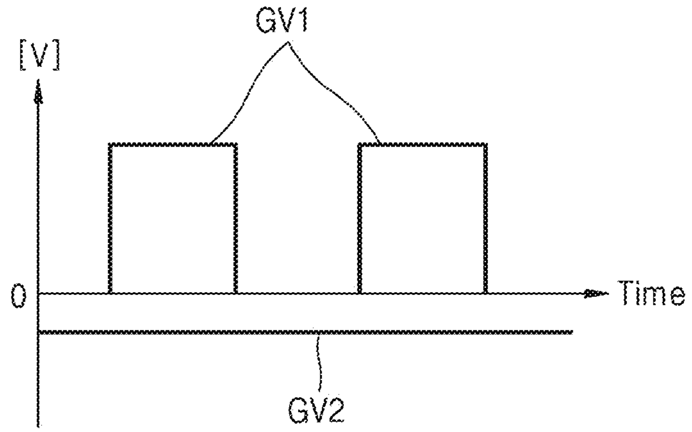
FIGS. 7A through 7D are diagrams illustrating examples where a first gate voltage and a second gate voltage that may be applied to a ferroelectric memory device are combined, according to an embodiment.

FIG. 7A illustrates a case where a first gate voltage is a rectangular pulse voltage having a positive value and a second gate voltage is a negative DC voltage.

Figure 7B:
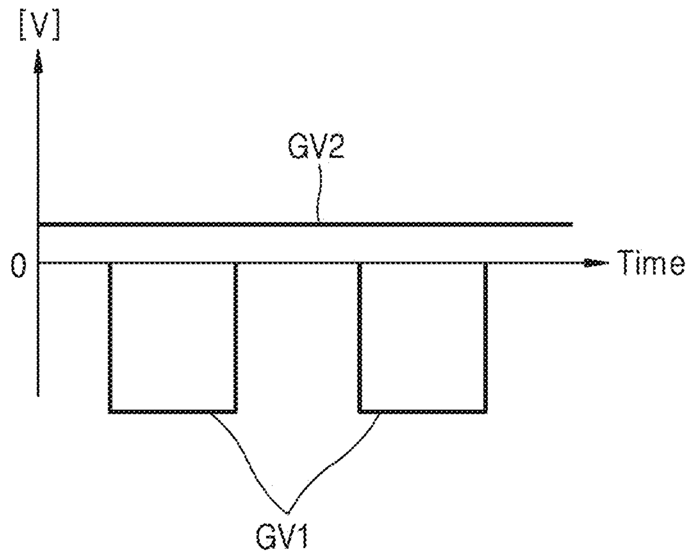

FIG. 7B illustrates a case where a first gate voltage is a rectangular pulse voltage having a negative value and a second gate voltage is a positive DC voltage.

Figure 7C:
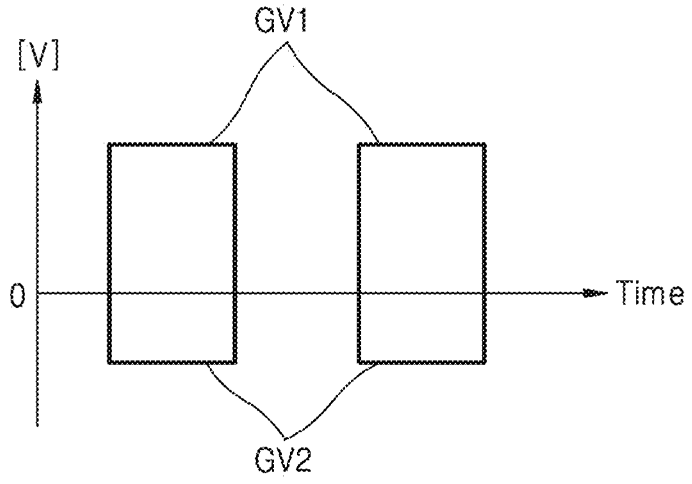

FIG. 7C illustrates a case where a first gate voltage is a rectangular pulse voltage having a positive value and a second gate voltage is a rectangular pulse voltage having a negative value. The first gate voltage and the second gate voltage may have the same pulse interval and width, and absolute values of pulse values may be different from each other.

Figure 7D:
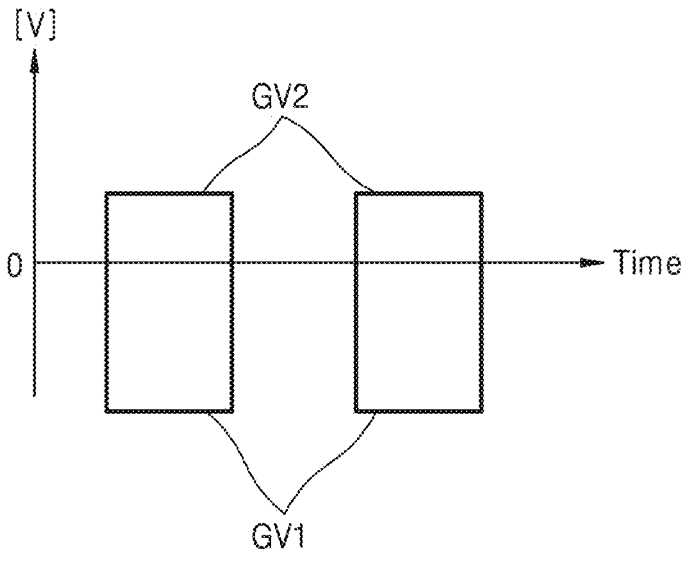

FIG. 7D illustrates a case where a first gate voltage is a rectangular pulse voltage having a negative value and a second gate voltage is a rectangular pulse voltage having a positive value. The first gate voltage and the second gate voltage may have the same pulse interval and width, and absolute values of pulse values may be different from each other.

In addition to the examples of FIGS. 7A through 7D, the first gate voltage VG1 and the second gate voltage VG2 may be combined in various ways.

Figure 8:
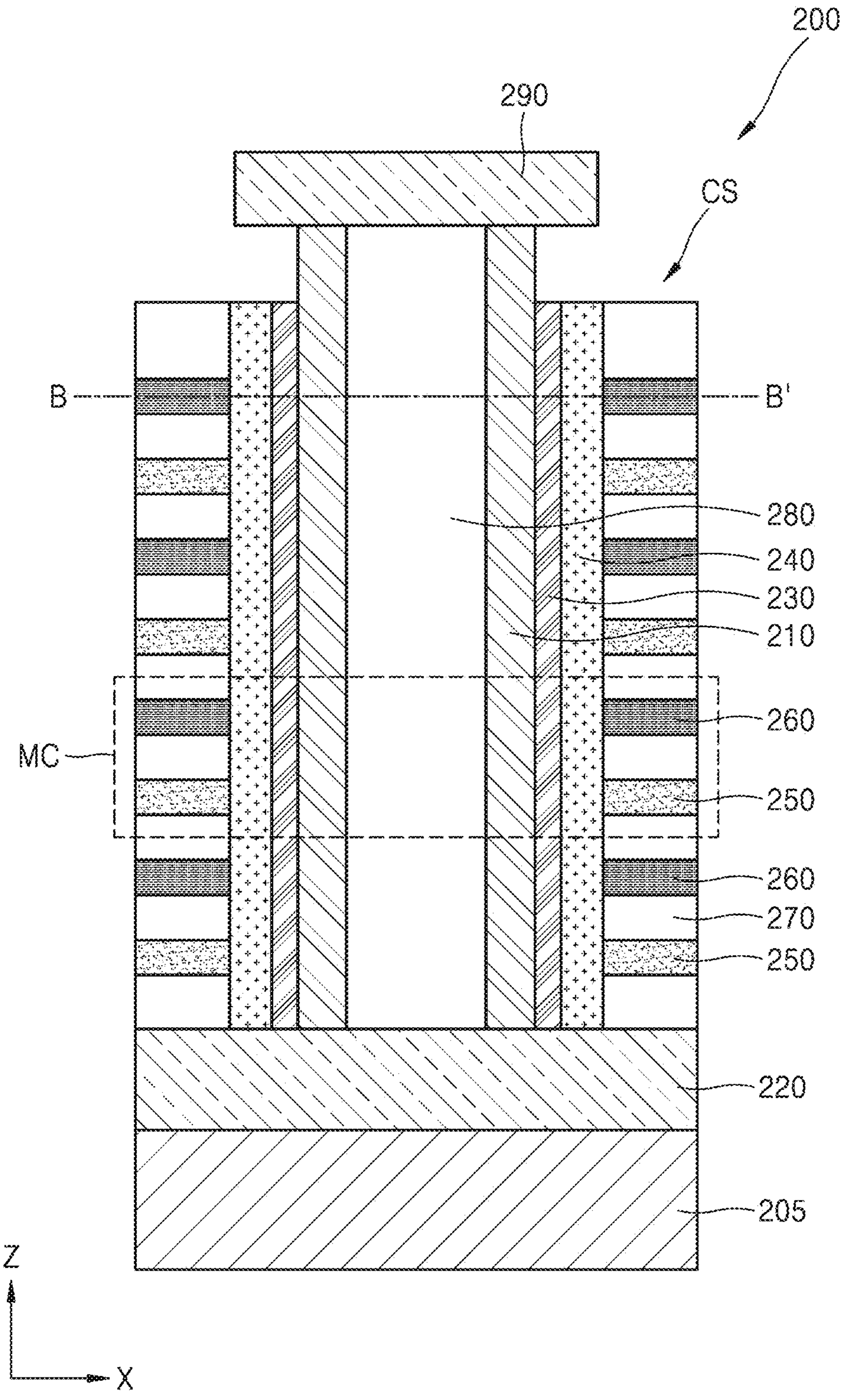
FIG. 8 is a cross-sectional view illustrating a structure of a ferroelectric memory device, according to another embodiment.
Figure 9:
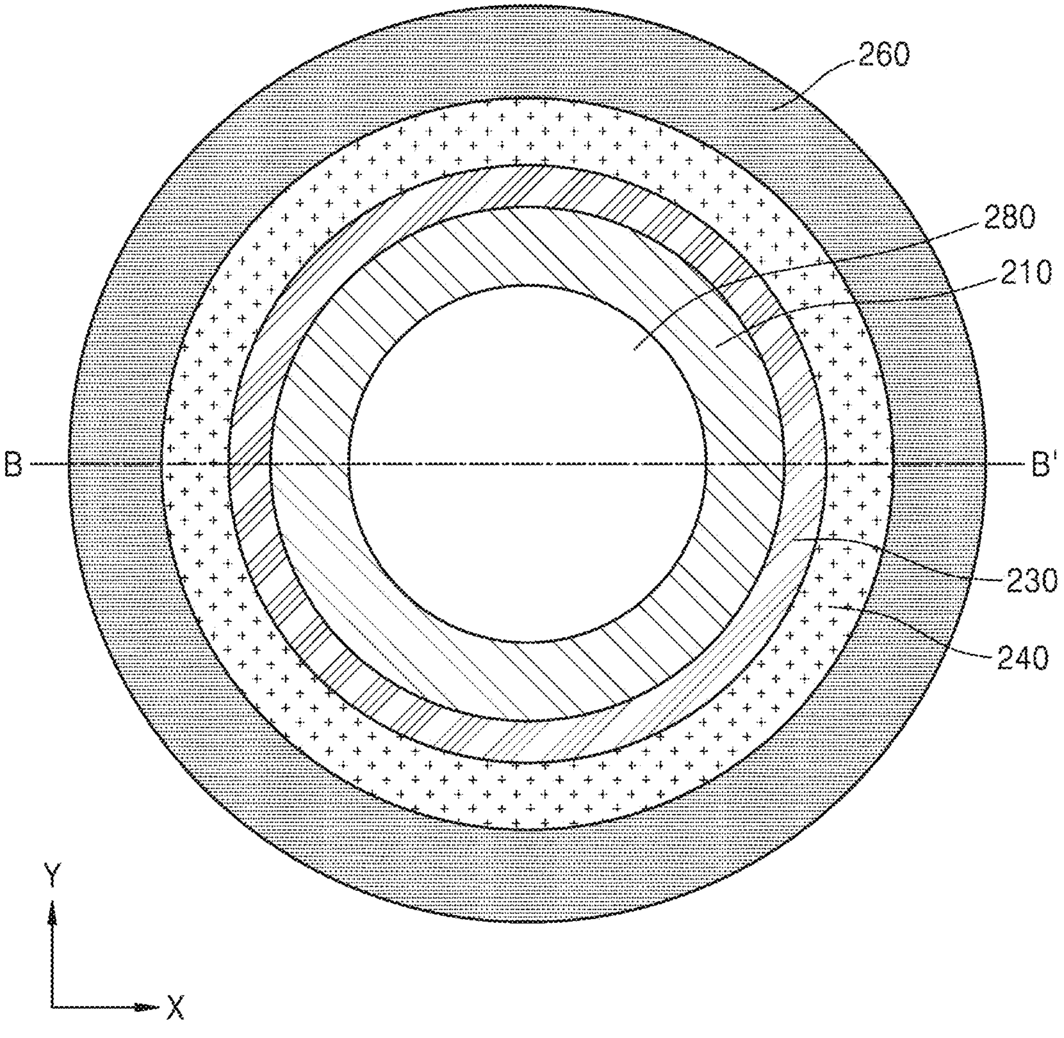
FIG. 9 is a plan view of a cross-section taken along line BB' of FIG. 8.
Figure 10:
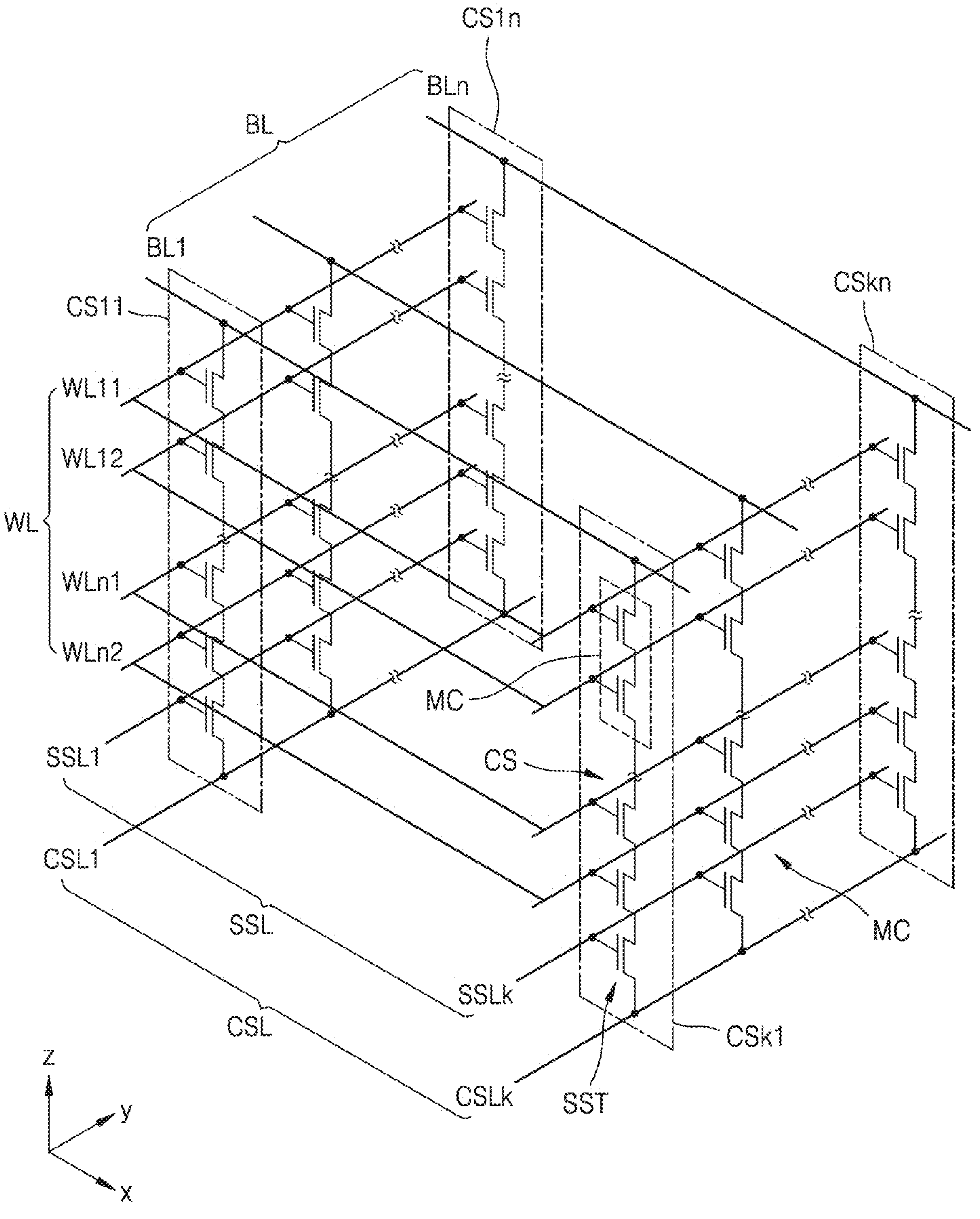
FIG. 10 is an equivalent circuit diagram of a plurality of ferroelectric memory devices of FIG. 8.

FIG. 8 is a cross-sectional view illustrating a structure of a ferroelectric memory device, according to another embodiment. FIG. 9 is a plan view of a cross-section taken along line BB' of FIG. 8. FIG. 10 is an equivalent circuit diagram of the ferroelectric memory device of FIG. 8.

Referring to FIG. 8, a ferroelectric memory device 200 may include a substrate 205 and a cell string CS formed on the substrate 205. Although one cell string CS is shown, this is merely an example, and the ferroelectric memory device 200 may include a plurality of cell strings. For example, the plurality of cell strings CS may extend in a first direction (Z direction) away from the substrate 205, and may be two-dimensionally arranged in a second direction and a third direction perpendicular to the first direction. As shown in FIG. 10, k*n cell strings may be provided and arranged in a matrix, and may be named CSij ($1 \leq i \leq k$, $1 \leq j \leq n$) according to row and column positions.

The substrate 205 may be a semiconductor substrate. The substrate 205 may include a silicon material doped with first type impurities. For example, the substrate 205 may include a silicon material doped with p-type impurities. For example, the substrate 205 may be a p-type well (e.g., a pocket p-well). However, the disclosure is not limited thereto.

A common source region 220 is provided on the substrate 205. The common source region 220 may include a material of a type different from that of a semiconductor material included in the substrate 205. For example, the common source region 220 may include an n-type material. The common source region 220 may be connected to a common source line CSL shown in the circuit diagram of FIG. 10.

The cell string CS may have a circular cross-section as shown in the cross-sectional view of FIG. 9. That is, the cell string CS may have a cylindrical shape with a central axis parallel to the Z direction. However, this is merely an example, and the cell string CS may be modified into an elliptical prism shape or a polygonal prism shape.

The cell string CS may include an insulating structure 280 having a cylindrical shape at a central portion thereof, and a channel layer 210, an insulating layer 230, and a ferroelectric layer 240 may sequentially surround a cylindrical surface of the insulating structure 280. A first gate electrode 250 and a second gate electrode 260 may alternately surround the ferroelectric layer 240 at different positions. The first gate electrode 250 and the second gate electrode 260 may be alternately arranged to be spaced apart from each other in an axial direction of the cell string CS, for example, the Z direction.

Materials of the channel layer 210, the insulating layer 230, the ferroelectric layer 240, the first gate electrode 250, and the second gate electrode 260 may include materials illustrated as materials of the channel layer 110, the insulating layer 130, the ferroelectric layer 140, the first gate electrode 150, and the second gate electrode 160 described with reference to FIG. 1. The insulating layer 230 may be omitted.

A separation layer 270 may be formed between the first gate electrode 250 and the second gate electrode 260. The separation layer 270 may function as a spacer for insulating the first gate electrode 250 from the second gate electrode 260. The separation layer 270 may include an insulating material, for example, silicon oxide. The separation layer 270 may include, for example, SiO, SiOC, or SiON.

An end of the channel layer 210, that is a portion of the channel layer 210 located at a lowermost end of the cell string CS, may contact the common source region 220.

A drain 290 may be provided on the cell string CS. The drain 290 may include, for example, a silicon material doped with n-type impurities. The other end of the channel layer 210, that is, a portion of the channel layer 210 located at a uppermost end of the cell string CS, may contact the drain 290.

The drain 290 may be connected to a bit line BL of FIG. 10. The drain 290 may be connected to the bit line BL through contact plugs.

The first gate electrode 250 and the second gate electrode 260 and the ferroelectric layer 240, the insulating layer 230, and the channel layer 210 facing the first and second gate electrodes 250 and 260 in a horizontal direction (X direction) constitute a memory cell MC.

The memory cells MC are continuously arranged in a vertical direction (Z direction) to constitute a cell string CS. The common source region 220 and the drain region 290 connected to both ends of the cell string CS may be respectively connected to the common source line CSL and the bit line BL shown in the circuit diagram of FIG. 10. The first gate electrode 250 and the second gate electrode 260 are connected to a word line WL. The first gate electrode 250 is connected to a word line WLi1 and the second gate electrode 260 is connected to a word line WLi2. When a voltage is applied to the word line WL, the common source line CSL, and the bit line BL, program, read, and erase processes may be performed on the plurality of memory cells MC.

As described above, a ferroelectric material of the ferroelectric layer 240 is a material in which even when a certain voltage is applied to a ferroelectric material and then the voltage is brought back to 0 V, a polarization value semi-permanently remains, and a polarity (direction) of such remanent polarization may depend on a polarity (direction) of an external voltage. A portion of the ferroelectric layer 240 corresponding to each memory cell MC may have remanent polarization corresponding to an electric field formed in the ferroelectric layer 240 due to a voltage applied to the first gate electrode 250 and a voltage applied to the second gate electrode 260. Conductance in the portion of the channel layer 210 corresponding to the memory cell MC may be changed by such a polarization direction of the ferroelectric layer 240, and information may be written or checked by using the changed conductance.

Also, in the ferroelectric memory device 200 according to an embodiment, an electric field may be formed in the ferroelectric material 240 by combining different voltages, for example, a pulse voltage and a DC voltage by using the first gate electrode 250 and the second gate electrode 260, and a change in conductance formed in the channel layer 210 may be linear. Accordingly, the ferroelectric memory device 200 may implement an analog memory, or may be applied to a non-volatile memory cell of a synaptic element for storing weights of a neuromorphic processor.

As shown in the circuit diagram of FIG. 10, each cell string CSij may be connected to the bit line BL, a string selection line SSL, the word line WL, and the common source line CSL.

Each cell string CSij includes the memory cells MC and a string selection transistor SST. The memory cells MC and the string selection transistor SST of each cell string CSij may be stacked in a height direction.

Rows of a plurality of cell strings CS are respectively connected to different string selection lines SSL1 through SSLk. For example, string selection transistors SST of cell strings CS11 through CS1*n* are commonly connected to the string selection line SSL1. String selection transistors SST of cell strings CSk1 through CSkn are commonly connected to the string selection line SSLk.

Columns of a plurality of cell strings CS are respectively connected to different bit lines BL1 through BLn. For example, memory cells MC and string selection transistors SST of the cell strings CS11 through CSk1 may be commonly connected to the bit line BL1, and memory cells MC and string selection transistors SST of the cell strings CS1*n* through CSkn may be commonly connected to the bit line BLn.

Rows of a plurality of cell strings CS may be respectively connected to different common source lines CSL1 through CSLk. For example, string selection transistors SST of the cell strings CS11 through CS1*n* may be commonly connected to the common source line CSL1, and string selection transistors SST of the cell strings CSk1 through CSkn may be commonly connected to the common source line CSLk.

The memory cell MC located at the same height from the string selection transistors SST or the substrate 205 is connected to a pair of word lines WLi1 and WLi2 ($1 \leq i \leq n$). The memory cells MC located at different heights may be respectively connected to different pairs of word lines WL11 and WL12 through WLn1 and WLn2).

This circuit structure is merely an example. For example, the number of rows of the cell strings CS may be increased or reduced. As the number of rows of the cell string CS is changed, the number of string selection lines connected to the rows of the cell string CS and the number of the cell strings CS connected to one bit line BL may also be changed. As the number of rows of the cell strings CS is changed, the number of common source lines connected to the rows of the cell strings CS may also be changed.

The number of columns of the cell strings CS may also be increased or reduced. As the number of columns of the cell string CS is changed, the number of the bit lines BL connected to the columns of the cell string CS and the number of the cell strings CS connected to one string selection line may also be changed.

A height of the cell string CS may also be increased or reduced. For example, the number of the memory cells MC stacked in the cell string CS may be increased or reduced. As the number of the memory cells MC stacked in the cell string CS is changed, the number of the word lines WL may also be modified. For example, string selection transistors provided to each cell string CS may be increased. As the number of string selection transistors provided to each cell strings CS is changed, the number of string selection lines or common source lines may also be changed. When the number of string selection transistors is increased, the string selection transistors may be stacked in the same manner as the memory cells MC.

For example, write and read processes may be performed in units of rows of the cell strings CS. The cell strings CS may be selected by the common source line CSL in units of one row, and the cell strings CS may be selected by the string selection lines SSL in units of one row. Also, a voltage may be applied to in the common source lines CSL in units of at least two common source lines. A voltage may be applied to the common source lines CSL in units of total common source lines.

In a selected row of the cell strings CS, write and read processes may be performed in units of pages. A page may be one row of the memory cells MC connected to one pair of word lines WLi1 and WLi2. In a selected row of the cell strings CS, the memory cells MC may be selected by one pair of word lines WLi1 and WLi2 in units of pages.

Figure 11:
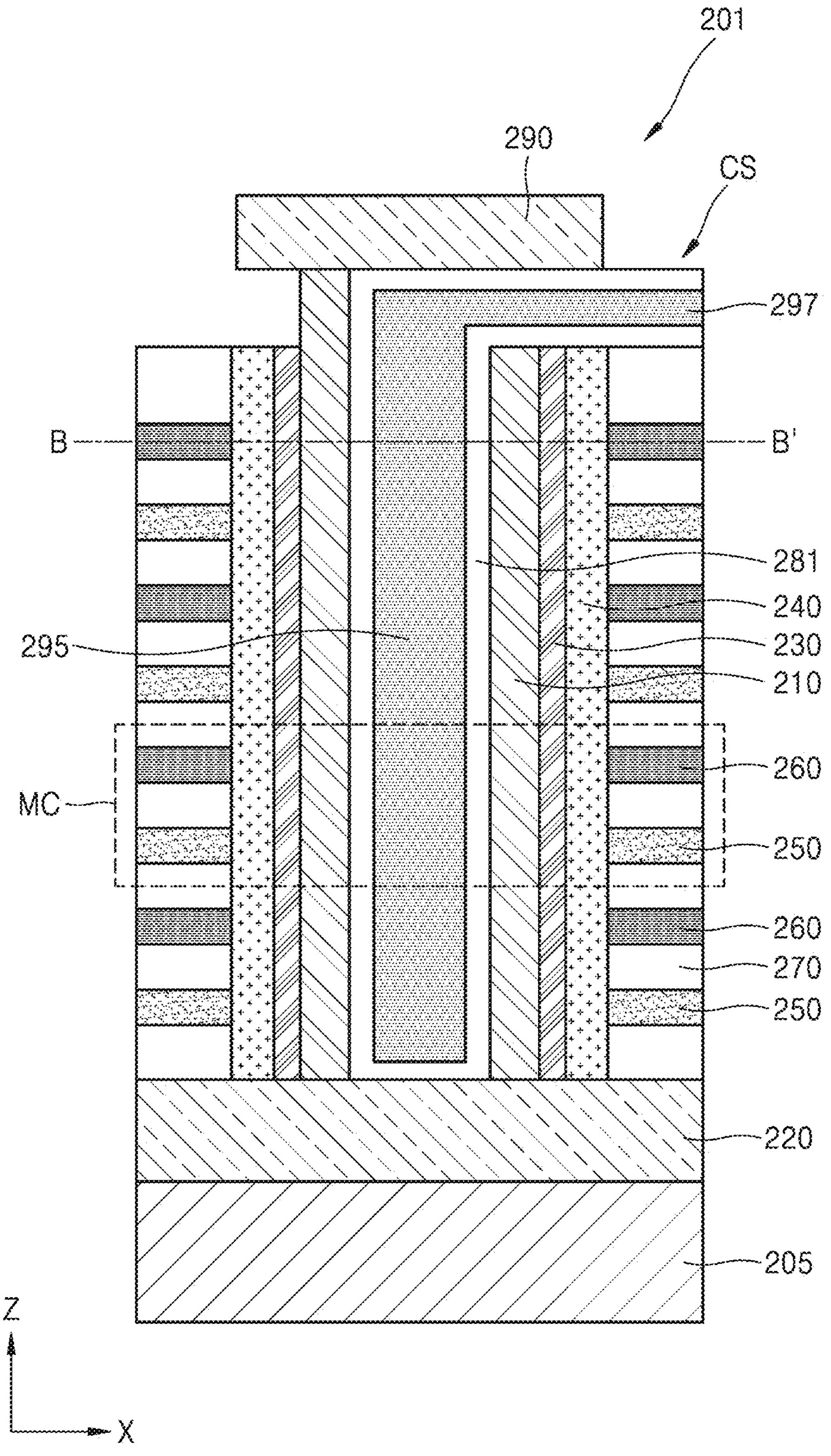
FIG. 11 is a cross-sectional view illustrating a structure of a ferroelectric memory device, according to another embodiment.
Figure 12:
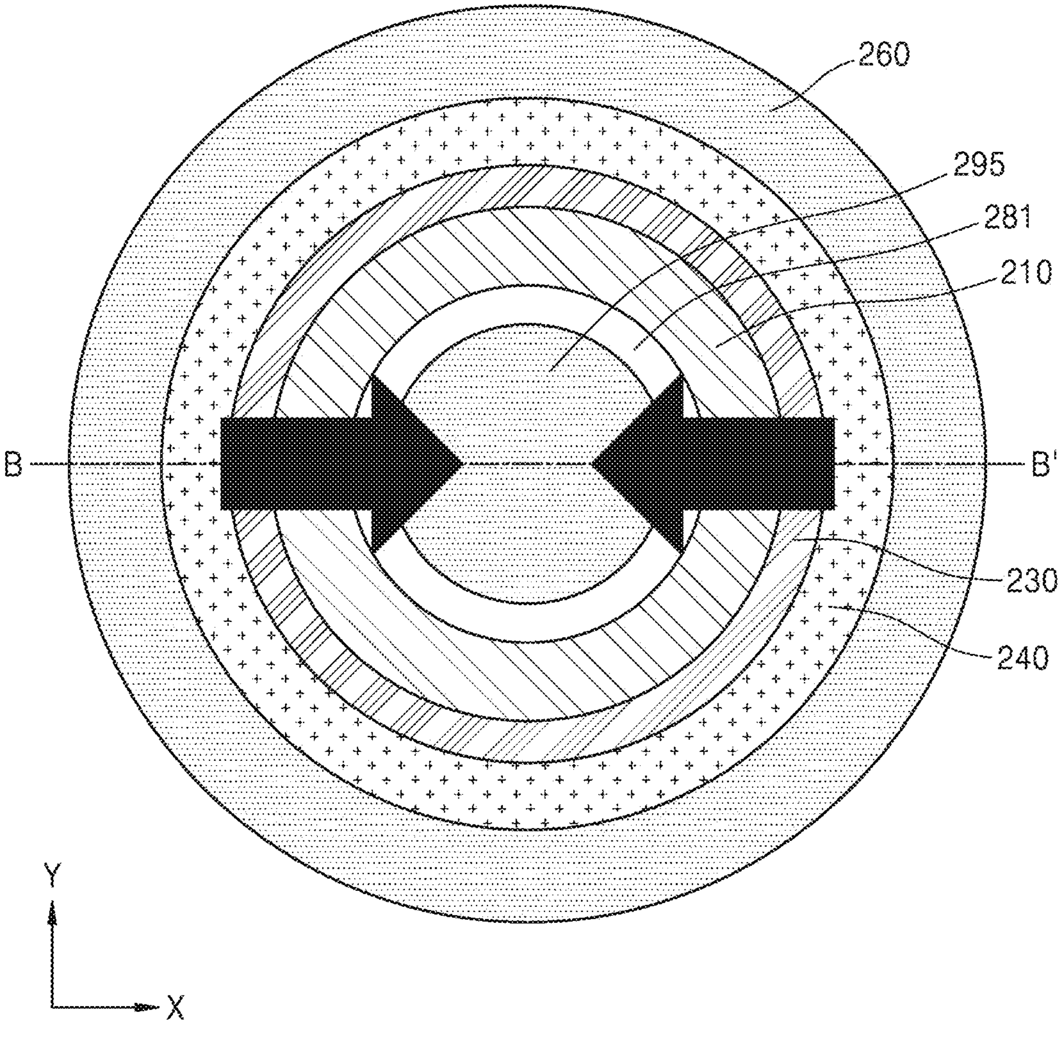
FIG. 12 is a plan view of a cross-section taken along line BB' of FIG. 11.

FIG. 11 is a cross-sectional view illustrating a structure of a ferroelectric memory device, according to another embodiment. FIG. 12 is a plan view of a cross-section taken along line BB' of FIG. 11.

A ferroelectric memory device 201 of the present embodiment is different from the ferroelectric memory device 200 of FIG. 8 in that a metal filler 295 is located at a central portion of the cell string CS, and the remaining elements are substantially the same.

The metal filler 295 may be formed of a metal material having excellent thermal and electrical conductivity. The metal filler 295 may discharge heat generated in the ferroelectric memory device 100 (201) to the outside. The metal filler 295 may maintain a constant electric potential with an external voltage. The metal filler 295 may be connected to an external conductive line 297 at an upper portion of the cell string CS. The metal filler 295 and the conductive line 297 may be formed of, but are not limited to, the same metal material.

An insulating material layer 281 may be located between the metal filler 295 and the channel layer 210. The insulating material layer 281 is a layer that fills a space between the metal filler 295 and the channel layer 210 with an insulating material. The insulating material layer 281 may include various insulating materials, for example, but not limited to, silicon oxide. The insulating material layer 281 may include a thermally conductive insulator such as thermally conductive ceramic.

The insulating material layer 281 may electrically insulate the metal filler 295 from the memory cell MC and may transfer heat generated in the memory cell MC to the metal filler 295.

The memory cells MC of the ferroelectric memory device 201 are vertically integrated and connected. Heat generated when the ferroelectric memory device 201 operates for a long time may cause a problem. For example, the channel layer 210 may be degraded by such self-heating.

Heat generated when each memory cell MC operates may be effectively discharged to the outside of the cell string CS through the metal filler 295 and the conductive line 297. Heat generated in the cell string CS is transferred to the metal filler 295 located at a central portion, and is discharged through the conductive line 297 connected to the metal filler 295. Accordingly, a problem caused by self-heating may be effectively limited and/or prevented.

A reference voltage may be applied to the metal filler 295 through the conductive line 297. The reference voltage may be constant regardless of voltages applied to the first gate electrode 250 and the second gate electrode 260. The reference voltage applied to the metal filler 295 may contribute to polarization switching characteristics of the ferroelectric layer 240, together with the voltages applied to the first gate electrode 250 and the second gate electrode 260.

The ferroelectric memory devices 100, 200, and 201 may be applied to a neural network device. For example, the ferroelectric memory devices 100, 200, and 201 or the memory cells MC included in the ferroelectric memory devices 100, 200, and 201 may be used as ferroelectric memory cells that store information (e.g., weight) about a connection strength between neurons.

Figure 13:
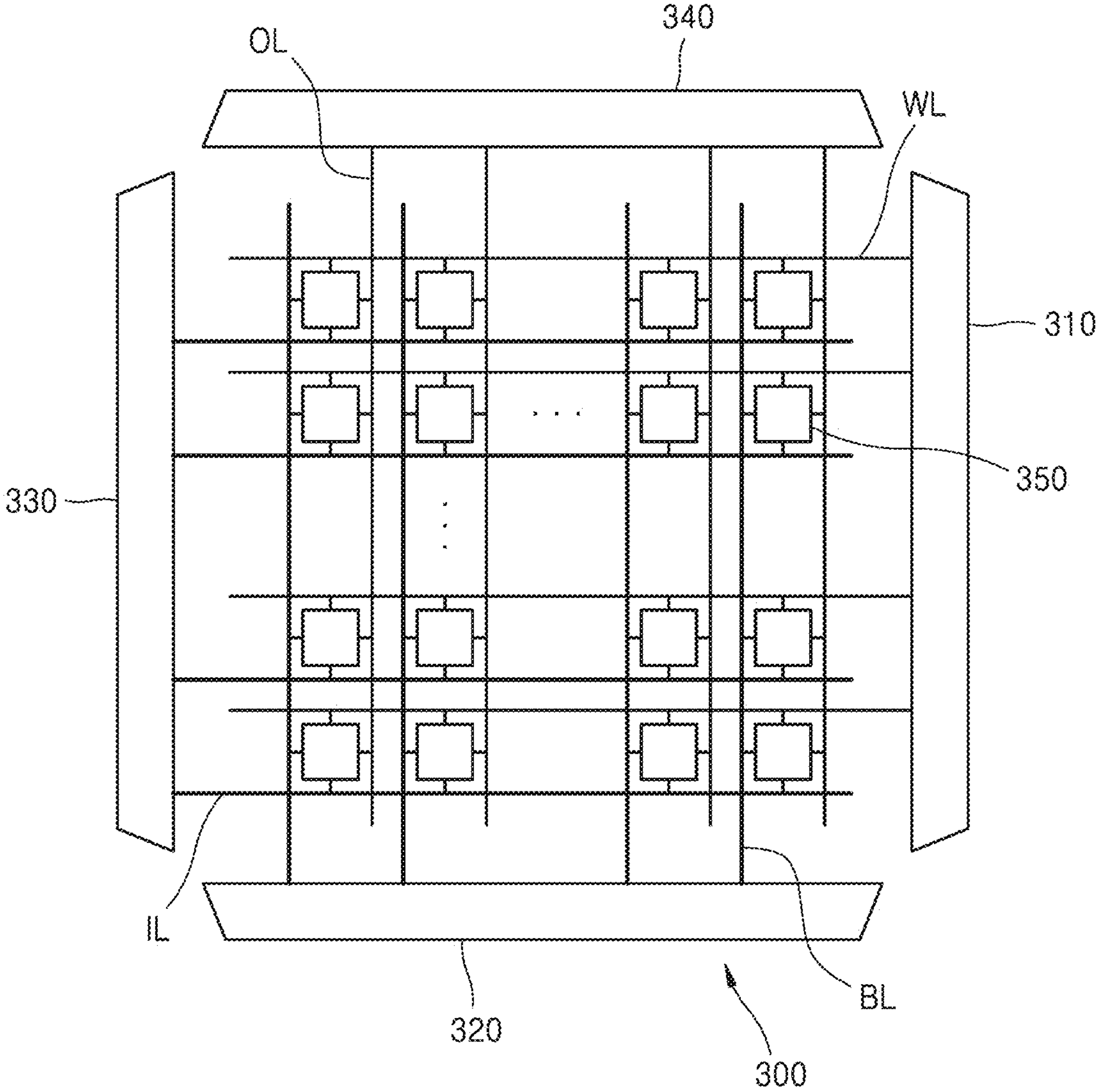
FIG. 13 is a block diagram schematically illustrating a configuration of a neural network device, according to an embodiment.

FIG. 13 is a block diagram schematically illustrating a configuration of a neural network device, according to an embodiment.

Referring to FIG. 13, a neural network device 300 may include a plurality of word lines WL, a plurality of bit lines BL, a plurality of input lines IL, a plurality of output lines OL, a plurality of synaptic elements 350, a word line driver 310 for applying a signal to the plurality of word lines WL, a bit line driver 320 for applying a signal to the plurality of bit lines BL, an input circuit 330 for applying a signal to the plurality of input lines IL, and an output circuit 340 for outputting a signal from the plurality of output lines OL. The output circuit 340 may include an analog-to-digital converter (ADC) connected to each of the plurality of output lines OL. Although not shown for convenience, the neural network device 300 may further include general-purpose elements in addition to the elements illustrated in FIG. 13.

The plurality of word lines WL and the plurality of bit lines BL may be arranged to intersect each other. The plurality of synaptic elements 350 may be located at intersections between the plurality of word lines WL and the plurality of bit lines BL. Accordingly, the plurality of synaptic elements 350 may be arranged in a 2D array. Although the plurality of input lines IL are arranged parallel to the plurality of word lines WL and the plurality of output lines OL are disposed parallel to the plurality of bit lines BL in FIG. 13, this is merely an example and an extending direction of the plurality of input lines IL and the plurality of output lines OL is not limited thereto. Each of the plurality of synaptic elements 350 may be electrically connected to any one of the plurality of word lines WL, any one of the plurality of bit lines BL, any one of the plurality of input lines IL, and any one of the plurality of output lines OL.

One unit synaptic element 350 may include one ferroelectric memory cell. The ferroelectric memory cell may be any of the ferroelectric memory devices 100, 200, and 201 according to the above embodiments or the memory cell MC included in any of the ferroelectric memory devices 100, 200, and 201.

Voltages applied to two gate electrodes of the ferroelectric memory cell included in the synaptic element 350 may be controlled by the word line driver 310 and the bit line driver 320. The word line driver 310 and the bit line driver 320 may apply different voltages, for example, a pulse voltage and a DC voltage or different pulse voltages, to a first gate electrode and a second gate electrode of the ferroelectric memory cell as described above.

One unit synaptic element 350 may further include an access transistor electrically connected to the ferroelectric memory cell and functioning as a selection device for turning on/off the synaptic element 350.

The access transistor may be electrically connected to any one of the plurality of word lines WL and may be electrically connected to any one of the plurality of bit lines BL. The access transistor may be controlled so that a desired pulse voltage or DC voltage is applied to each of two gate electrodes provided in the ferroelectric memory cell by the word line driver 310 and the bit line driver 320.

A source of the ferroelectric memory cell may be electrically connected to any one of the plurality of input lines IL, and a drain of the ferroelectric memory cell may be electrically connected to any one of the plurality of output lines OL.

During a learning operation of the neural network device 300, the access transistor may be individually turned on through the individual word line WL, and a program pulse may be applied to a gate of the ferroelectric memory cell through the bit line BL. A signal of training data may be applied through the input line IL. A weight may be stored in each ferroelectric memory cell through such a process. To this end, the word line driver 310 may be configured to sequentially apply a turn-on signal to the plurality of word lines WL, during the learning operation of the neural network device 300. The bit line driver 320 may be configured to apply a weight signal to the plurality of bit lines BL, during the learning operation of the neural network device 300.

During an inference operation of the neural network device 300, all access transistors may be turned on through all of the plurality of word lines WL, and a read voltage Vread may be applied through the bit line BL. Currents from the synaptic elements 350 connected in parallel to the output lines OL are aggregated and flow in each output line OL. The output circuit 340 may convert current flowing through each output line OL into a digital signal. To this end, the word line driver 310 may be configured to apply a turn-on signal to all of the plurality of word lines WL, during the inference operation of the neural network device 300. The bit line driver 320 may be configured to apply a read voltage to the plurality of bit lines BL, during the inference operation of the neural network device 300.

According to an embodiment, because the ferroelectric memory cell included in the synaptic element 350 has linear state change characteristics, a weight may be linearly updated in the synaptic element 350 of the neural network device 300. In other words, a weight or a synaptic connection strength may be linearly changed in proportion to a program pulse provided through the bit line BL.

Figure 14:
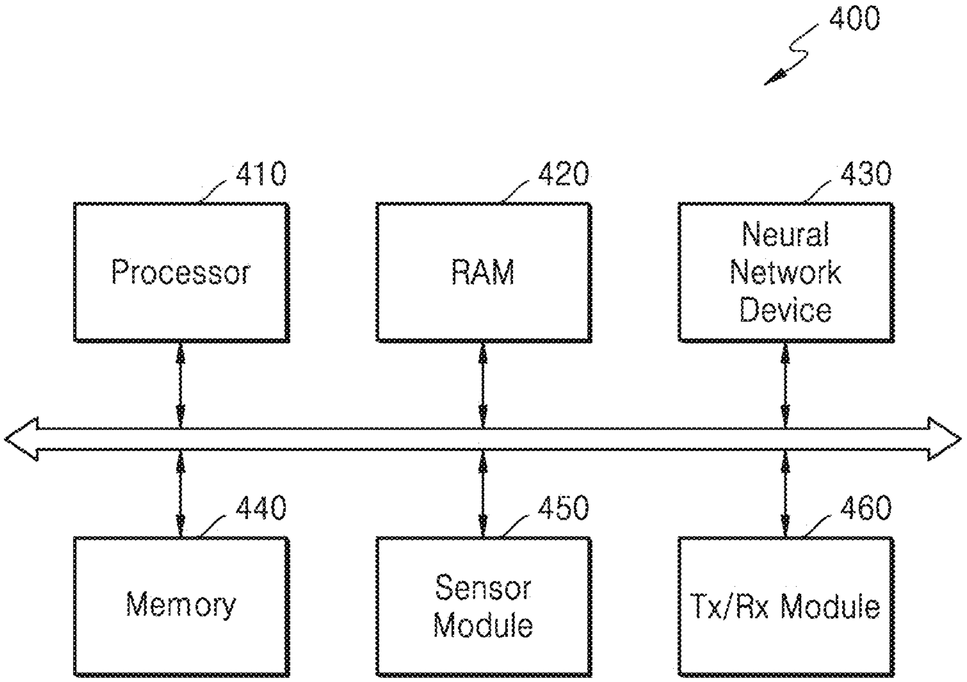
FIG. 14 is a block diagram schematically illustrating a configuration of an electronic device including a neural network device.

FIG. 14 is a block diagram schematically illustrating a configuration of an electronic device including a neural network device. Referring to FIG. 14, an electronic device 400 may extract valid information by analyzing in real time input data based on a neural network, and may determine a situation based on the extracted information, or may control elements of a device onto which the electronic device 400 is mounted. For example, the electronic device 400 may be applied to a robot device such as a drone or an advanced driver-assistance system (ADAS), a smart TV, a smartphone, a medical device, a mobile device, an image display device, a measuring device, and an Internet of Things (IoT) device, and may also be mounted onto at least one of various types of devices in addition.

The electronic device 400 may include a processor 410, a random-access memory (RAM) 420, a neural network device 430, a memory 440, a sensor module 450, and a communication module 460. The electronic device 400 may further include an input/output module, a security module, a power control device, etc. Some of hardware components of the electronic device 400 may be mounted on at least one semiconductor chip.

The processor 410 controls an overall operation of the electronic device 400. The processor 410 may include a single processor core, or multi-processor cores. The processor 410 may process or execute programs and/or data stored in the memory 440. In some embodiments, the processor 410 may control a function of the neural network device 430, by executing the programs stored in the memory 440. The processor 410 may be implemented as a central processing unit (CPU), a graphics processing unit (GPU), or an application processor (AP).

The RAM 420 may temporarily store programs, data, or instructions. For example, the programs and/or data stored in the memory 440 may be temporarily stored in the RAM 420 according to booting code or control of the processor 410. The RAM 420 may be implemented as a memory such as a dynamic RAM (DRAM) or a static RAM (SRAM).

The neural network device 430 may perform an operation of a neural network based on received input data, and may generate an information signal based on a result of the operation. Examples of the neural network may include, but are not limited to, a convolutional neural network (CNN), a recurrent neural network (RNN), a feedforward neural network (FNN), a long short-term memory (LSTM), a stacked neural network (SNN), a state-space dynamic neural network (SSDNN), a deep belief network (DBN), and a restricted Boltzmann machine (RBM). The neural network device 430 may be a hardware accelerator for a neural network or a device including the hardware accelerator. The neural network device 430 may perform not only an operation of a neural network but also a read operation or a write operation.

The neural network device 430 may correspond to the neural network device 300 described with reference to FIG. 13. Because the neural network device 430 may implement a weight having linear state change characteristics, the accuracy of a neural network operation performed by the neural network device 430 may be increased and a more sophisticated neural network may be implemented.

An information signal may include one of various types of recognition signals such as a voice recognition signal, an object recognition signal, an image recognition signal, or a biometric information recognition signal. For example, the neural network device 430 may receive frame data included in a video stream as input data, and may generate, from the frame data, a recognition signal for an object included in an image represented by the frame data. However, the disclosure is not limited thereto, and the neural network device 430 may receive various types of input data according to a type or a function of a device onto which the electronic device 400 is mounted, and may generate a recognition signal according to the input data.

The neural network device 430 may perform, for example, linear regression, logistic regression, statistical clustering, Bayesian classification, decision trees, principal component analysis, and/or a machine learning model including an expert system, and/or an ensemble method such as a random forest. Such a machine learning model may be used to provide various services such as an image classification service, a biometric information or biometric data-based user authentication service, an ADAS, a voice assistant service, and an automatic speech recognition (ASR) service.

The memory 440 that is a storage for storing data may store an operating system (OS), various programs, and various data. In an embodiment, the memory 440 may store intermediate results generated in a process of performing an operation of the neural network device 430.

The memory 440 may be, but is not limited to, a DRAM. The memory 440 may include at least one of a volatile memory or a non-volatile memory. Examples of the non-volatile memory include read-only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), and ferroelectric RAM (FRAM). Examples of the volatile memory include DRAM, SRAM, synchronous DRAM (SDRAM), PRAM, MRAM, RRAM, and FRAM. In an embodiment, the memory 440 may include at least one of a hard disk drive (HDD), a solid state drive (SSD), a compact flash (CF), a secure digital (SD) memory, a micro-SD memory, a mini-SD memory, or a memory stick.

The sensor module 450 may collect information around a device onto which the electronic device 400 is mounted. The sensor module 450 may sense or receive a signal (e.g., an image signal, a voice signal, a magnetic signal, a biometric signal, or a touch signal) from the outside of the electronic device 400, and may convert the sensed or received signal into data. To this end, the sensor module 450 may include at least one of various types of sensing devices, such as a microphone, an imaging device, an image sensor, a light detection and ranging (LiDAR) sensor, an ultrasonic sensor, an infrared sensor, a biosensor, and a touch sensor.

The sensor module 450 may provide the data as input data to the neural network device 430. For example, the sensor module 450 may include an image sensor, and may generate a video stream by capturing an image of an external environment of the electronic device 400 and may sequentially provide consecutive data frames of the video stream as input data to the neural network device 430. However, the disclosure is not limited thereto, and the sensor module 450 may provide various types of data to the neural network device 430.

The communication module 460 may include various wired or wireless interfaces that may communicate with an external device. For example, the communication module 460 may include a communication interface connectable to a wired local area network (LAN), a wireless local area network (WLAN), such as wireless fidelity (Wi-Fi), a wireless personal area network (WPAN), such as Bluetooth, a wireless universal serial bus (USB), Zigbee, near-field communication (NFC), radio-frequency identification (RFID), power line communication (PLC), or a mobile cellular network such as 3rd generation (3G), 4th generation (4G), or long term evolution (LTE), or a 5G (5th Generation) communication system.

The memory device may have linear response characteristics to an applied voltage. For example, conductivity between a source and a drain may be linearly changed according to a program voltage applied to a gate. Accordingly, a neural network device including a ferroelectric field-effect transistor according to an embodiment may guarantee excellent multi-level characteristics, linearity, and reliability. Also, a neural network device may operate at a low voltage and low power by using a ferroelectric field-effect transistor having small switching energy.

Figure 15:
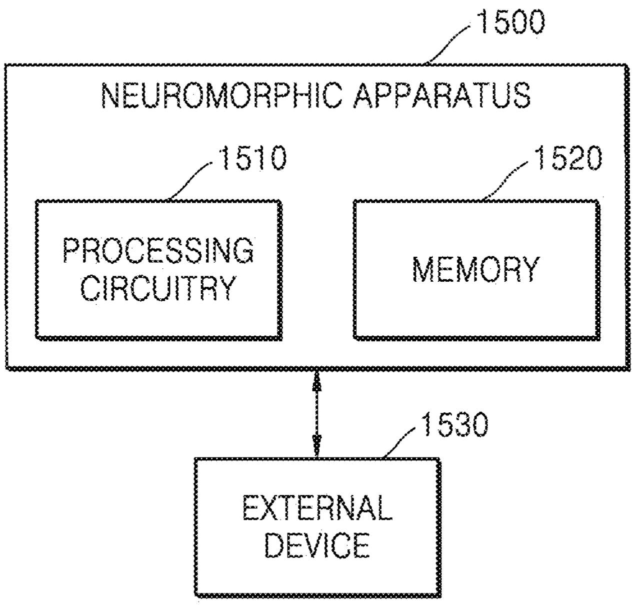
FIG. 15 is a diagram of a neuromorphic apparatus and an external device connected thereto in accordance with some example embodiments.

FIG. 15 is a diagram of a neuromorphic apparatus and an external device connected thereto in accordance with some example embodiments.

Referring to FIG. 15, a neuromorphic apparatus 1500 may include processing circuitry 1510 and/or a memory 1520. The processing circuitry 1510 may include a hardware such as a logic circuit, a hardware/software combination such as a processor configured to execute software, or a combination thereof. For example, the processor may include a CPU, a graphics processing unit (GPU), an application processor (AP) included in the neuromorphic apparatus 1500, an ALU, a digital signal processor, a microcomputer, a FPGA, a SoC, a programmable logic unit, a microprocessor, and an ASIC, but is not limited thereto. The neuromorphic apparatus 1500 may include a memory based on the ferroelectric memory devices in FIGS. 8 to 10 and 11 to 12, the neural network device in FIG. 13, or the electronic device 400 in FIG. 400.

In some example embodiments, the processing circuitry 1510 may read/write various data with respect to an external device 1530, and/or may be configured to execute the neuromorphic apparatus 1500 using the read/written data. In some embodiments, the external device 1530 may include an external memory and/or a sensor array, each having an image sensor (for example, a complementary metal-oxide-semiconductor (CMOS) image sensor circuit).

In some example embodiments, the processing circuitry 1510 may be configured to control a function for driving the neuromorphic apparatus 1500. For example, the processing circuitry 1510 may be configured to control the neuromorphic apparatus 1500 by executing a program stored in the memory 1520.

In some embodiments, the neuromorphic apparatus 1500 may be applied to a machine learning system. The machine learning system may use various artificial neural network organizing and processing models such as a convolutional neural network (CNN), a deconvolutional neural network, a recurrent neural network (RNN) including a long short-term memory (LSTM) unit and/or a gated recurrent unit (GRU), a stacked neural network (SNN), a state-space dynamic neural network (SSDNN), a deep faith network (DBN), a generative adversarial network, and/or a restricted Boltzmann machine (RBM).

Alternatively, or additionally, the machine learning system may include other forms of machine learning models, for example, linear and/or logistic regression, statistical clustering, Bayesian classification, decision tree, dimensionality reduction such as principal component analysis, an expert system, and/or a combination thereof including ensembles such as random forests. These machine learning models may be used to provide various services and/or applications. For example, an image classification service, a user authentication service based on biometrics or biometric data, an advanced driver assistance system (ADAS), a voice assistant service, or an automatic speech recognition (ASR) service may be executed by an electronic device.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims.

What is claimed is:

1. A ferroelectric memory device comprising:

a source;

a drain;

a channel layer between the source and the drain, the channel layer connected to the source and the drain;

a first gate electrode on the channel layer;

a second gate electrode on the channel layer and spaced apart from the first gate electrode;

a ferroelectric layer, the ferroelectric layer between the channel layer and the first gate electrode, and the ferroelectric layer being between the channel layer and the second gate electrode;

an insulating layer between the ferroelectric layer and the channel layer, the insulating layer being in direct contact with the ferroelectric layer; and a voltage applying unit configured to apply voltages to the first gate electrode and the second gate electrode, wherein the voltage applying unit is further configured to apply a pulse voltage to any one of the first gate electrode and the second gate electrode, and apply a direct current (DC) voltage or a different type of pulse voltage from the pulse voltage to other of the first gate electrode and the second gate electrode.

2. The ferroelectric memory device of claim 1, wherein a direction in which the first gate electrode and the second gate electrode are apart from each other is perpendicular to a stacking direction in which the channel layer and the ferroelectric layer are stacked.

3. The ferroelectric memory device of claim 1, wherein the voltage applying unit is further configured to apply a first voltage, which is a pulse voltage, to the first gate electrode, and apply a second voltage that is a DC voltage to the second gate electrode.

4. The ferroelectric memory device of claim 3, wherein a pulse pattern of the first voltage is a rectangular pulse pattern or a triangular pulse pattern.

5. The ferroelectric memory device of claim 1, wherein the voltage applying unit is further configured to apply a first voltage, which is a pulse voltage, to the first gate electrode, and apply a second voltage, which is a different type of pulse voltage from the first voltage, to the second gate electrode.

6. The ferroelectric memory device of claim 5, wherein a pulse width of the first voltage and a pulse width of the second voltage are same, a pulse interval of the first voltage and a pulse interval of the second voltage are same, and a pulse value of the first voltage and a pulse value of the second voltage have different signs.

7. The ferroelectric memory device of claim 1, further comprising:

an insulating structure located on a first surface of the channel layer, wherein the first surface of the channel layer is opposite a second surface of the channel layer, and the second surface of the channel layer faces the ferroelectric layer.

8. The ferroelectric memory device of claim 1, further comprising a substrate including the source, wherein the channel layer is on the source, the channel layer extending in a direction perpendicular to the substrate, the ferroelectric layer extends in the direction perpendicular to the substrate, the first gate electrode is one of a plurality of first gate electrodes, the second gate electrode is one of a plurality of second gate electrodes, and the plurality of first gate electrodes and the plurality of second gate electrodes alternately arranged and spaced apart from each other along the ferroelectric layer and in the direction perpendicular to the substrate.

9. The ferroelectric memory device of claim 7, further comprising:

a metal filler, wherein the insulating structure has a cylindrical shell shape and surrounds the metal filler.

10. The ferroelectric memory device of claim 1, wherein the ferroelectric layer comprises at least one of:

an oxide of Si doped with at least one of Al, Y, La, Gd, Mg, Ca, Sr, Ba, Ti, Zr, Hf, and N;

an oxide of Al doped with at least one of Si, Y, La, Gd, Mg, Ca, Sr, Ba, Ti, Zr, Hf, and N;

an oxide of Hf doped with at least one of Si, Al, Y, La, Gd, Mg, Ca, Sr, Ba, Ti, Zr, and N;

an oxide of Zr doped with at least one of Si, Al, Y, La, Gd, Mg, Ca, Sr, Ba, Ti, Hf, and N;

MgZnO;

AlScN;

$BaTiO_3$;

$Pb(Zr,Ti)O_3$;

$SrBiTaO_7$; or polyvinylidene fluoride (PVDF).

11. The ferroelectric memory device of claim 1, wherein the channel layer comprises at least one of Si, Ge, SiGe, a group III-V semiconductor, an oxide semiconductor, a nitride semiconductor, an oxynitride semiconductor, a two-dimensional (2D) material, quantum dots, and an organic semiconductor.

12. A neural network device comprising:

a plurality of word lines;

a plurality of bit lines intersecting the plurality of word lines;

a plurality of input lines;

a plurality of output lines;

a plurality of synaptic elements at intersections between the plurality of word lines and the plurality of bit lines, and each of the plurality of synaptic elements being electrically connected to a corresponding one of the plurality of word lines, a corresponding one of the plurality of bit lines, a corresponding one of the plurality of input lines, and a corresponding one of the plurality of output lines, a word line driver configured to apply a signal to the plurality of word lines;

a bit line driver configured to apply a signal to the plurality of bit lines;

an input circuit configured to apply a signal to the plurality of input lines; and an output circuit configured to output a signal from the plurality of output lines, wherein each of the plurality of synaptic elements comprises a ferroelectric memory cell, wherein the ferroelectric memory cell comprises a source, a drain, a channel layer between the source and the drain and connected to the source and the drain, a first gate electrode on the channel layer, a second gate electrode on the channel layer and spaced apart from the first gate electrode, a ferroelectric layer located between the channel layer and the first gate electrode, and the ferroelectric layer is between the channel layer and the second gate electrode, and an insulating layer between the ferroelectric layer and the channel layer, the insulating layer being in direct contact with the ferroelectric layer;

wherein the word line driver and the bit line driver are configured to apply a pulse voltage to any one of the first gate electrode and the second gate electrode and configured to apply a direct current (DC) voltage or a different type of pulse voltage from the pulse voltage to an other of the first gate electrode and the second gate electrode.

13. The neural network device of claim 12, wherein the ferroelectric memory cell of a corresponding one of the plurality of synaptic elements is a corresponding ferroelectric memory cell, the source of the corresponding ferroelectric memory cell is electrically connected to one of the plurality of input lines, and the drain of the corresponding ferroelectric memory cell is electrically connected to one of the plurality of output lines.

14. An electronic device comprising:

the neural network device of claim 12;

a memory; and a processor configured to control a function of the neural network device by executing programs stored in the memory, wherein the neural network device is configured to perform a neural network operation, based on input data received from the processor, and generate an information signal corresponding to the input data based on a result of the neural network operation.

15. An operating method of a ferroelectric memory device, the ferroelectric memory device comprising a source; a drain; a channel layer between the source and the drain, the channel layer connected to the source and the drain; a first gate electrode on the channel layer; a second gate electrode on the channel layer and spaced apart from the first gate electrode; a ferroelectric layer, the ferroelectric layer between the channel layer and the first gate electrode, and the ferroelectric layer being between the channel layer and the second gate electrode; and an insulating layer between the ferroelectric layer and the channel layer, the insulating layer being in direct contact with the ferroelectric layer, the method comprising:

applying a pulse voltage to any one of the first gate electrode and the second gate electrode, and applying a direct current (DC) voltage or a different type of pulse voltage from the pulse voltage to other of the first gate electrode and the second gate electrode.

* * * * *